United States Patent
Mira

[11] Patent Number: 5,709,263
[45] Date of Patent: Jan. 20, 1998

[54] HIGH PERFORMANCE SINUSOIDAL HEAT SINK FOR HEAT REMOVAL FROM ELECTRONIC EQUIPMENT

[75] Inventor: Ali Mira, San Jose, Calif.

[73] Assignee: Silicon Graphics, Inc., Mountain View, Calif.

[21] Appl. No.: 551,070

[22] Filed: Oct. 19, 1995

[51] Int. Cl.$^6$ ........................................... F28F 7/00
[52] U.S. Cl. ................ 165/80.3; 165/185; 174/16.3; 257/722; 361/704; 361/718
[58] Field of Search .................... 165/80.3, 155; 174/16.3; 257/722; 361/697, 703, 704, 707, 718

[56] References Cited

U.S. PATENT DOCUMENTS

| | | | |
|---|---|---|---|
| 4,982,345 | 1/1991 | Callahan | 364/521 |
| 5,019,880 | 5/1991 | Higgins, III | 165/80.3 X |
| 5,241,452 | 8/1993 | Kitajo | 361/718 |
| 5,304,846 | 4/1994 | Azar et al. | 257/722 |
| 5,413,166 | 5/1995 | Kerner et al. | 165/185 X |

FOREIGN PATENT DOCUMENTS

| 269855 | 9/1992 | Japan | 257/722 |
|---|---|---|---|

OTHER PUBLICATIONS

Chu, R.C., "Counter–Flow Cooling System" IBM TDB, vol. 8, No. 11, Apr. 1966, p. 1692.

Randolph, J.B., "Transistor Heat Sink" IBM TDB, vol. 14, No. 5, Oct. 1971, pp. 1489–1490.

*Primary Examiner*—Leonard R. Leo
*Attorney, Agent, or Firm*—Blakely, Sokoloff, Taylor & Zafman

[57] ABSTRACT

A heat sink with undulating fins is provided. The heat sink according to this invention includes a thermally conductive base plate having a top surface and a plurality of thermally conductive fins. The fins extend upwardly from the top surface. Each fin is integral with the base plate and has an undulating surface. The fin surfaces of adjacent fins define a space for passing a cooling fluid between them.

5 Claims, 5 Drawing Sheets

FIG_1

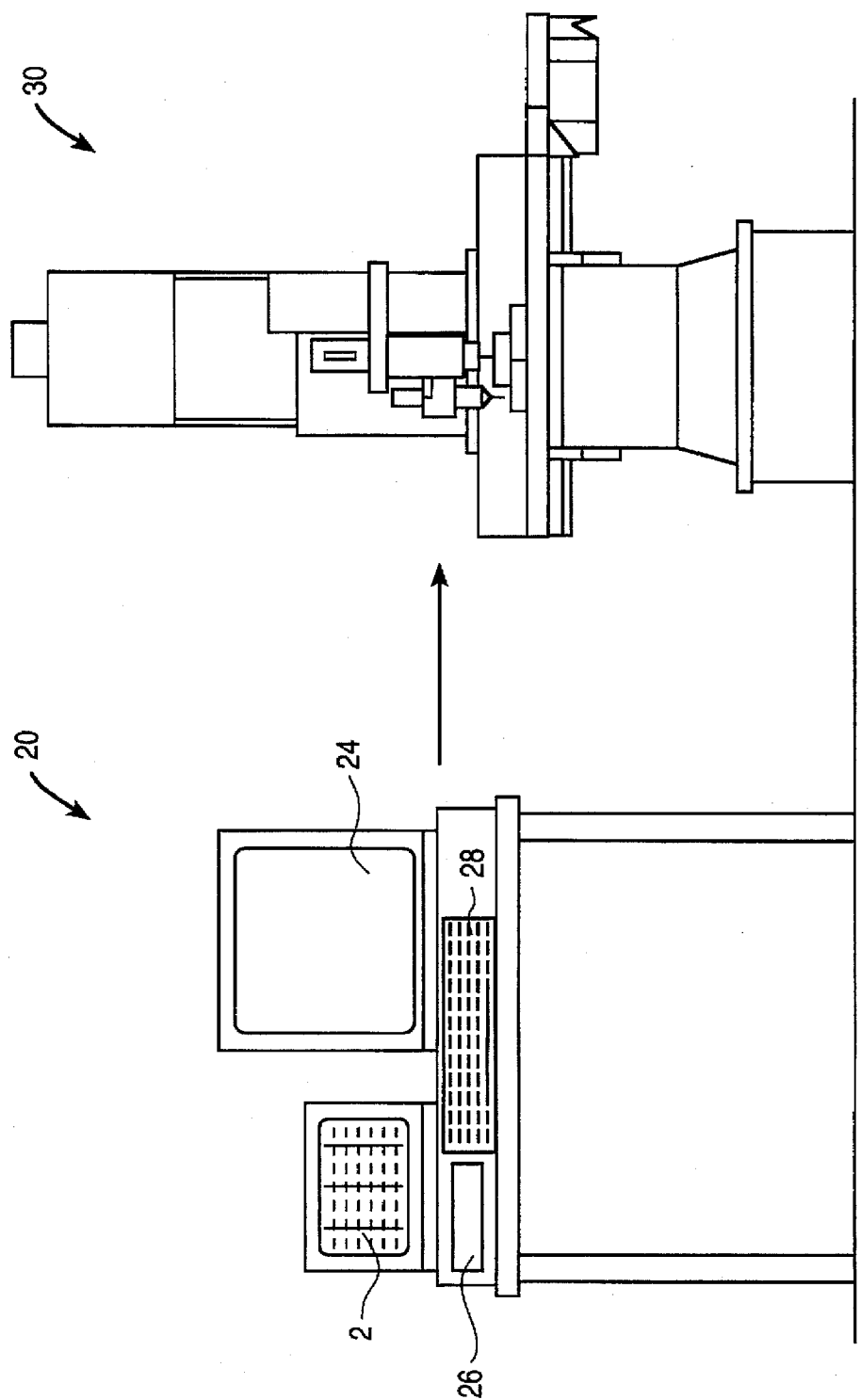
FIG_3

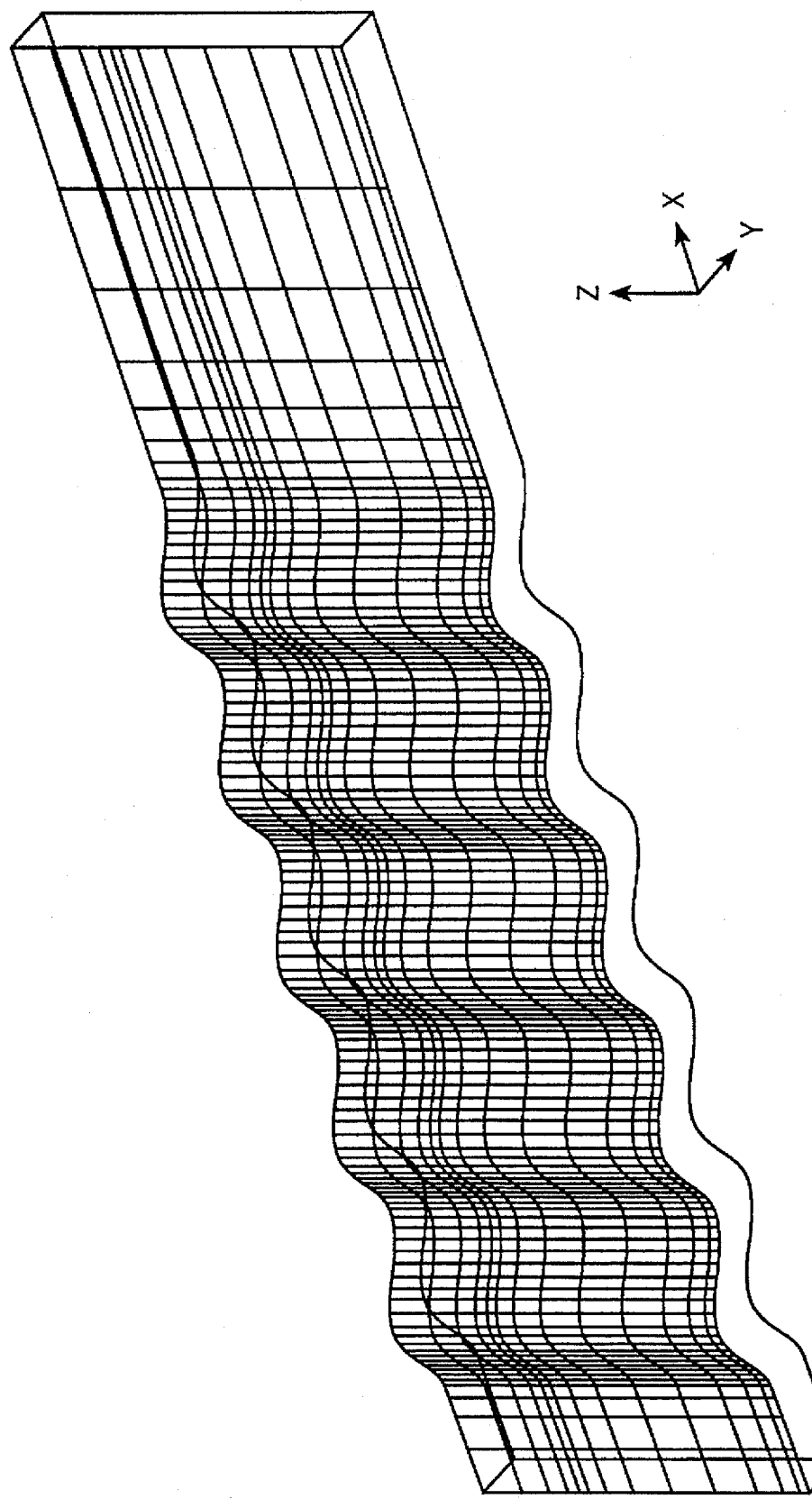
FIG_4

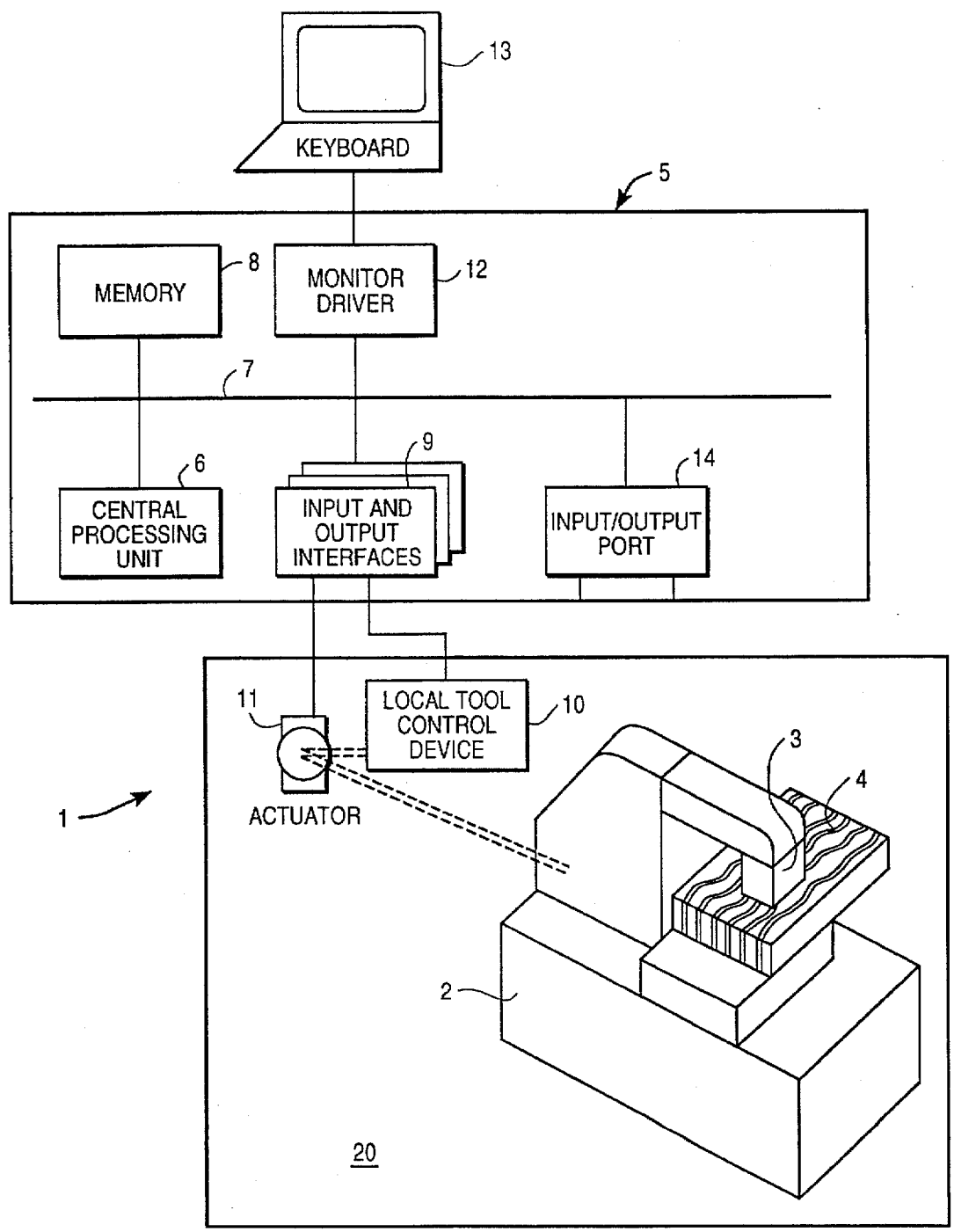
FIG_5

HIGH PERFORMANCE SINUSOIDAL HEAT SINK FOR HEAT REMOVAL FROM ELECTRONIC EQUIPMENT

BACKGROUND OF THE INVENTION

(1) Field of the Invention

The present invention relates to devices and methods for cooling electronic components. More specifically, the present invention relates to a heat sink for providing improved heat removal from electronic devices.

(2) Description of the Related Art

Heat sinks are devices used in conjunction with electronic and microelectronic components for the purpose of cooling these devices. Generally, electronic devices can be cooled by attaching these devices to heat sinks. Heat sinks can absorb and dissipate part of the heat generated by the attached electronic devices during the operation of these devices. To provide optimal heat transfer, heat sinks are designed to have, generally, a large surface area. A surface area is any area of the heat sink in contact with a cooling fluid. The size of the surface area can generally determine the heat dissipating capacity of a heat sink. While large surface areas are desirable, such areas take up a large volume on the circuit board. An important goal in designing heat sinks is to decrease the volume occupied by heat sinks on the circuit board, while increasing the surface area of these heat sinks.

Most heat sinks are attached to the devices to be cooled by means of a base plate. Typically heat sinks have a plurality of fins upwardly extending from the base plate. The fins conduct heat from the base plate and dissipate this heat to a cooling fluid flowing through spaces located between the fins. Typically the cooling space defined by these fins is limited by the base plate and the vertical surfaces of two adjacent fins. The cooling fluid flows within the heat sink through the cooling spaces thereby making contact with the fins, removing the heat by thermal dissipation (convection) from the fins, and further driving the dissipated heat outside of the heat sink. One way to optimize the volume occupied by heat sinks, yet preserving a desired heat transfer coefficient (a measure of heat removal), is to accommodate a larger fin surface on the heat sink. A large fin surface exposed to the cooling fluid confers improved convective cooling to the device to be cooled. Currently, most heat sinks have straight fins, i.e. the vertical surface of the fins is flat. A flat fin surface, however, does not offer the advantage of utilizing minimal base plate surface, while providing a relatively large fin surface.

Typically, for most conventional heat sinks, the fins are attached to the base plate subsequent to the building of the base. For example, the fins can be attached to the base by welding, epoxying, or brazing. Attaching the fins to the base after building the base, however, creates non-uniformity in the heat sink. The non-uniformity caused by the above-mentioned processes prevents heat sinks from achieving superior performance due to a poor contact between the fins and the base plate. Moreover, attaching the fins to the base plate after building the base plate can be very expensive. Furthermore, heat sinks built by brazing, welding, or epoxying the fins to the base plate cannot be processed by machining. Implementation of the heat sink manufacturing process on an automated metal processing machine such as a Numerical Control (NC) machine or other computerized machine is desirable because the heat sinks built by such machines can be easily prototyped or optimized and subsequently manufactured at lower costs.

It is thus desirable to provide a heat sink that can be optimized and prototyped in a short time, thus, arriving at projected design parameters in a very short time. It is also desirable to provide a heat sink, which includes fins made of the same material as the base, without having to subsequently attach the fins to the base. It is further desirable to provide heat sinks having fins with a high heat dissipation capability but occupying a relatively small volume. Last, it is desirable to provide a method for manufacturing heat sinks in a fast and cheap way.

BRIEF SUMMARY OF THE INVENTION

A heat sink according to the present invention typically includes: a thermally conductive base plate having a base surface; and a plurality of thermally conductive fins upwardly extending from the base surface, each fin being integral with the base plate and each fin further having an undulating fin surface. The fin surfaces of adjacent fins define a space for passing a cooling fluid there between.

The present invention further provides for a heat sink including a thermally conductive base plate having a top surface. The base plate has a first end and a second end, opposite to the first end. The heat sink according to the present invention further includes a plurality of thermally conductive fins upwardly extending from the top surface, each fin being integral with the base plate. Each fin further has an undulating fin surface laterally extending from the first end to the second end of the base plate. The fin surfaces of adjacent fins define a space therebetween for passing a cooling fluid. Each fin has a first lateral edge upwardly extending from the first end of the base plate, the lateral edge being backwardly inclined with respect to the top surface. The inclination of the first lateral edge defines a predetermined acute angle with an axis orthogonal to the first end.

The present invention further offers a method for providing a heat sink having a desired predetermined temperature response range. The method includes the following steps:

(a) generating a three dimensional (3D) heat sink model on a computer aided design (CAD) system; (b) generating a first file including data representing the heat sink model; (c) inputting the first file into a simulator; (d) causing the simulator to simulate a behavior of the model, according to the first file and responsive to the simulation, generating a second file, the second file including a thermal map of the heat sink model; (e) comparing the thermal map of the heat sink with the desired predetermined temperature response range; (f) if the thermal map does not fall within said predetermined temperature response range, then generating an optimized heat sink model and replacing the content of the first file with data representing the optimized model, and repeating the sequence of steps c through e; (g) if the thermal map falls within the desired predetermined thermal response range then translating the first file into a standard data file; (h) inputting the standard data file to a numerical control (NC machine); and (i) fabricating the heat sink having the desired predetermined temperature response range, according to the standard data file, by processing a solid workpiece on the numerical control (NC) machine.

BRIEF DESCRIPTION OF THE DRAWINGS

The features, aspects, and advantages of the present invention will become more fully apparent from the following detailed description, appended claims, and accompanying drawings in which:

FIGS. 3 shows a computerized system for providing a heat sink according to the present invention;

FIG. 4 illustrates a computer graphics generated model of one sinusoidal fin of the heat sink according to the present invention; and FIG. 5 illustrates a Numerical Control (NC) Machine for building a heat sink according to the present invention.

DETAILED DESCRIPTION OF THE INVENTION

In the following description, numerous specific details are set forth to provide a thorough understanding of the present invention. However, one having ordinary skills in the art may be able to practice the invention without these specific details. In some instances, well-known circuits, structures, and techniques have not been shown in detail to not unnecessarily obscure the present invention.

The present invention provides for a heat sink device having undulating fins integral with the base plate. This invention also provides a method for building a heat sink entirely of a single piece of material. The use of one single piece of material for the heat sink confers the advantage of machining the heat sink in a short amount of time, therefore, allowing for cheap and fast prototyping and optimization. Moreover, a heat sink made of a single piece of material provides better heat removal from electronic components affixed thereto as opposed to heat sinks having the fins subsequently attached to the base.

Figure 1:
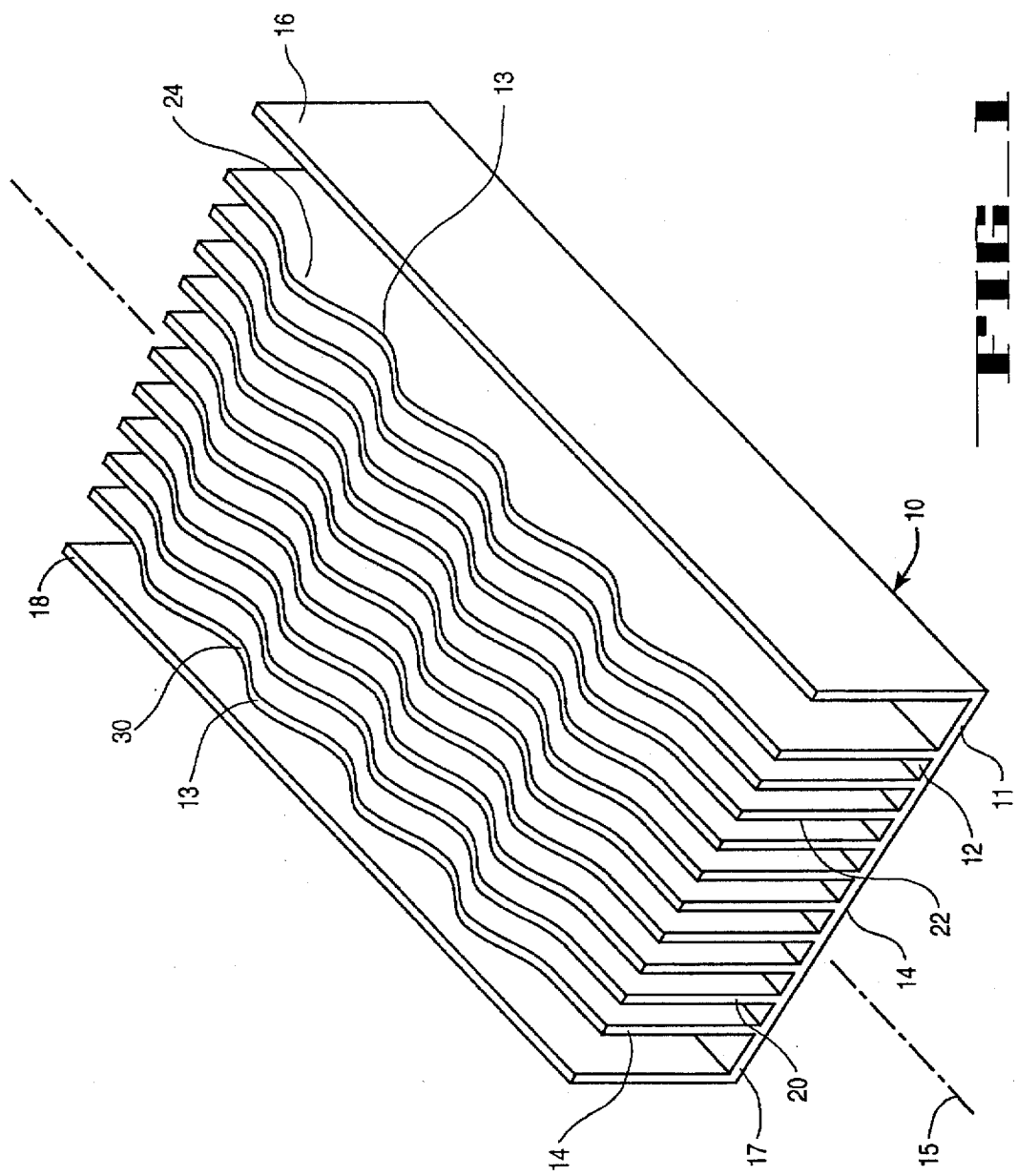
FIG. 1 is a perspective view of a heat sink in accordance with the present invention.

FIG. 1 is a perspective view of one embodiment of a heat sink in accordance with the present invention. The heat sink 10 includes a thermally conductive base plate 11 having a top surface 12 and a back surface (not shown). In this Figure the base plate is substantially rectangular. The back surface of the base plate can be generally attached to or mounted onto one or more electronic devices or parts to be cooled. A collection of thermally conductive fins 20, integral with the base plate 11, upwardly extend from the top surface 12. By having the fins and the base plate made of the same piece of material, the heat sink according to the present invention offers improved heat transfer. In this figure, each fin has a vertical surface 24 with a plurality of undulations 13 which confer the fin a substantially sinusoidal shape with respect to a longitudinal axis 15. Fins 20 have undulations on each side 24 of these fins (FIG. 1 only shows one side of these fins). The vertical surface of the fins laterally extends length-wise from a first lateral end 17 to a second lateral end (not shown). The fins 20 can have any shape that increases the surface area in contact with a cooling fluid flown through the heat sink. A cooling fluid can be flown through the heat sink 10 via a plurality of cooling spaces 22. These spaces are defined by the vertical surfaces of two adjacent fins and the top surface 12.

The undulations of the fins 20 allow for a greater surface area of fins per unit area of base plate. As such, a greater overall surface of fins is in contact with the cooling fluid flown through the heat sink. Consequently, better cooling is achieved per unit area of base plate. In other words, as opposed to straight fins having the same geometry of the base plate, the heat sink with substantially sinusoidal fins according to the present invention allows a larger surface of the fins to be exposed to the cooling fluid. The substantially sinusoidal surface of the fins also causes increased heat transfer per unit area of fin because the sinusoidal pattern of these fins disrupts a boundary layer of air at several locations along the fins. A boundary layer is a layer of slow moving fluid which forms on a surface when the fluid is moving on that surface. Most of the heat transfer from the base plate to the cooling fluid occurs through this boundary layer. The sinusoidal fins 20 cause this boundary layer to be perturbed at several locations along the fins in an oscillatory pattern, hence, enhancing the heat transfer mechanism.

The base plate 11 and the fins 20 are made of a material having a high thermal conductivity such as, by way of non-limiting example, aluminum, or magnesium for dissipating heat from the electronic devices to be cooled. A cooling fluid, such as air, by way of non-limiting example, is flown at the front end 14 or at the back end (not shown) of the heat sink through the cooling spaces 22 formed between the fins. Hereinafter, in the description which follows, reference will be made to air as the cooling fluid by way of non-limiting example. Initial modeling shows that a heat sink with sinusoidal fins can have a 5 to 10 degrees Celsius cooler base plate than straight fin heat sinks made of the same material. This reduction in the temperature of the heat sink is conveyed to the electronic device(s) or component(s) to which the heat sink is attached.

In FIG. 1, the fins 20 integrally extending from the top surface 12 are substantially parallel to one another. Additionally, the fins 20 are substantially perpendicular to top surface 12. Furthermore, the fins 20 are spaced apart from one another at predetermined intervals. Typically these intervals are substantially equal and determine the width of the cooling space between the fins. Additionally, the fins 20 have a predetermined thickness, which in conjunction with other parameters such as the interval between the fins, the geometry of the fins and of the base plate 11, the thermal conductivity of the material from which the heat sink is made, and the desired temperature range at which the heat sink is projected to function, can be optimized by using a computational fluid dynamics (CFD) simulator. More about the computational fluid dynamics simulator and the optimization of the heat sink will be explained later in this section.

Furthermore, the base plate 11 has a rectangular shape, although the shape of this base plate is not limited to rectangular. This base plate can have other shapes depending on the application for which the heat sink is designed. Typically, the heat sink according to the present invention is affixed with its base plate onto a component to be cooled. In the preferred embodiment, the base plate 11 is generally made of aluminum and is about (0.1~0.5) inches thick. Other materials may also be used depending on the desired application.

As shown in FIG. 1, the heat sink 10 has a pair of side walls 16 and 18. The side walls extend upward along the length of base plate 11. As shown in FIG. 1, the side walls 16, 18 are formed by folding over the edges of the base plate 11, although other means could be used. The side walls 16 and 18 provide for ease of handling in the manufacturing process. Furthermore, FIG. 1 shows ten sinusoidal fins 20 disposed between side walls 16 and 18. The heat sink according to the present invention, however, is not limited to this number of fins, but rather can have a number of fins which can vary according to the desired temperature range and the rest of the geometrical parameters. Similarly, the heat sink according to the present inventions can have undulations other than sinusoidal, depending on the projected performance of the heat sink. The number of fins together with the other parameters enumerated above can be changed subsequent to a thermal simulation of the heat sink, explained later in this section, in view of optimizing the performance of the heat sink.

Figure 2:
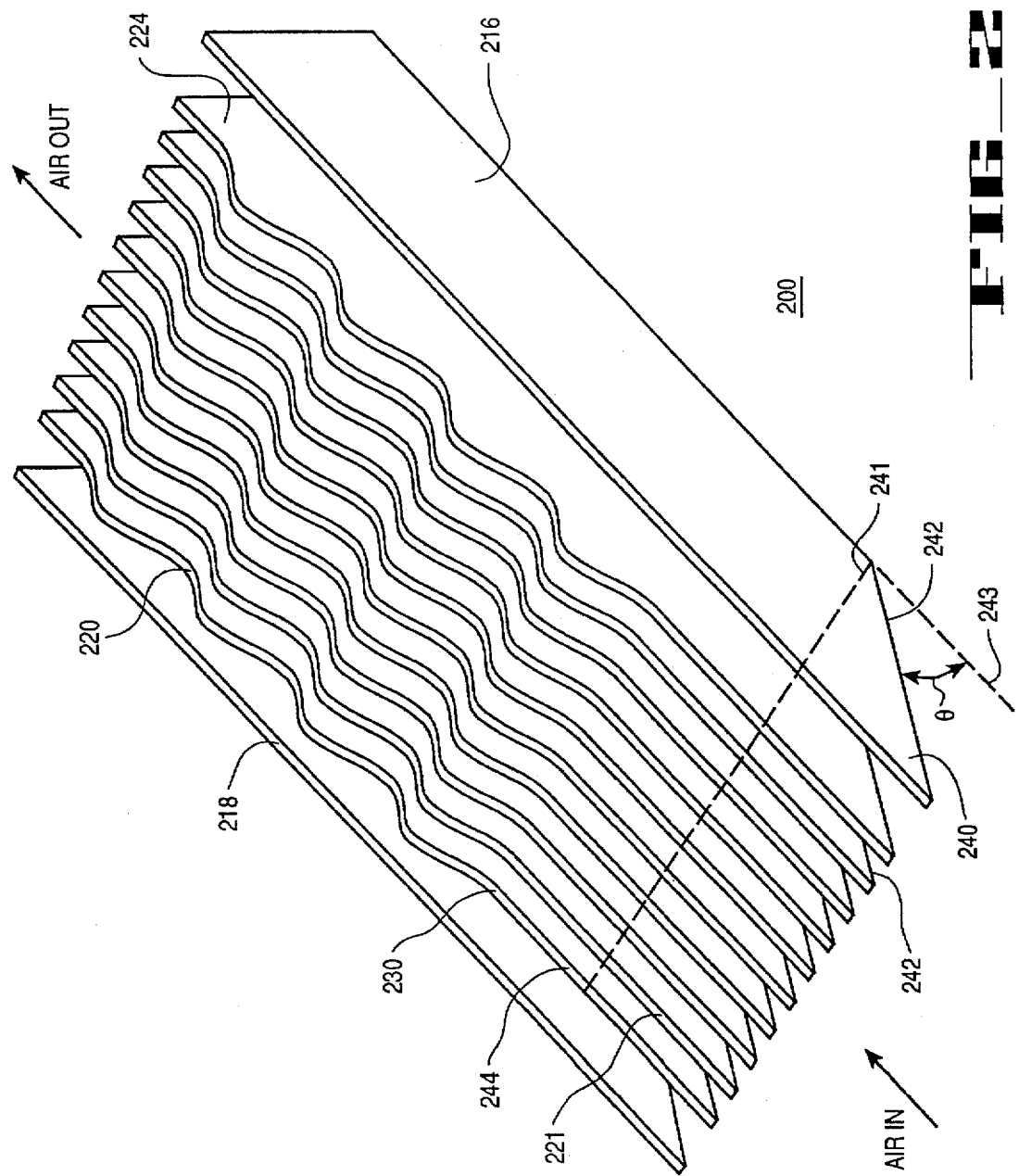
FIG. 2 shows an alternative embodiment of a sinusoidal heat sink having an angled entrance according to the present invention.

FIG. 2 illustrates an alternative embodiment according to the present invention. As one can see, this Figure displays a sinusoidal heat sink having an angled entrance. The entrance to the heat sink includes a plurality of fins 221 which have, in this particular embodiment, a pseudo-triangular shape. Each such fin 221 is contiguous with the corresponding sinusoidal fin 220, the thickness of the triangular fins 221 being substantially equal to the thickness of the sinusoidal fins 220. Moreover, each pseudo-triangular fin 221 has an upper side 244 which is contiguous with the top side 230 of the sinusoidal fins 220. Furthermore, each triangular fin 221 has an inclined lateral edge 242 upwardly extending from a first end 241 of the base plate (shown in dotted line). The lateral edges 242 are backwardly inclined with respect to the top surface of the base (not shown). The lateral edges make an acute angle $\theta$ with longitudinal axis 243 which is orthogonal to the first end 241. In this particular embodiment, by way of non-limiting example, the acute angle $\theta$ is approximately 30 degrees.

The angled entrance described above provides substantial advantages to the transfer of heat in the heat sink according to the present invention. For example, this entrance contributes to more air flowing through the interior of the heat sink allowing, thus, the lowest part of the fins, closer to the base plate, to have enhanced contact with the cooling air. Generally, for heat sinks having a straight entrance, i.e. the lateral edge of the fins at the entrance of the heat sink makes an angle of 90 degrees with the base, as opposed to heat sinks with angled entrance, as soon as the air approaching the entrance of the heat sink impacts the lateral edges of the fins the air is deflected upwardly. In this case a significant part of the air flowing through the heat sink exits the heat sink before having the opportunity to substantially interact with the fins. This effect is called "bypassing" and interferes with optimal heat removal from the component to be cooled. By contrast, using a heat sink with an angled entrance, as shown in FIG. 2, the air will "dive" into the heat sink, thereby impacting the vertical fins substantially along their entire surface. The remaining structure of the heat sink with an angled entrance is substantially similar to the structure of the embodiment illustrated in FIG. 1, and thus the above-description of the structure shown in FIG. 1 is incorporated herein by reference with respect to FIG. 2.

The integral structure of the heat sink according to the present inventions allows for processing the heat sink on a Numerical Control (NC) machine. The capability of machining the heat sink by a NC machine provides a fast way for obtaining heat sink prototypes, as integral heat sinks can be machined in a relatively short amount of time. Once the desired heat sink prototype has been obtained through optimization, one can use that prototype for building a die cast. The die cast can then be used for mass production of heat sinks by molding thus causing substantial reduction in the cost of manufacture.

FIG. 3 shows diagrammatically a system used in the process of providing a heat sink according to the present invention. A method for providing a heat sink having a desired predetermined temperature response range according to the present invention can, by way of non-limited example, be implemented by using the system shown in FIG. 3. A predetermined temperature response range can be defined as the range of temperatures within which a heat sink can be found when the heat sink responds to a cooling fluid having a certain temperature. Initially, according to this method, a three-dimensional heat sink model is generated on the system 20 which includes a video display monitor 24, coupled to an automatic computer-aided design (AUTO CAD) system 28. A three-dimensional heat sink model, can thus be created by the CAD system 28 and displayed on monitor 24. Based on the 3D heat sink model generated on monitor 24, the CAD computer system 28 generates a first data file, including data related to the geometry of the heat sink such as the fin thickness, the sinusoidal function representing the surface of the fins, the intervals between the fins, the thickness of the base plate, etc.

Subsequently, this first data file is inputted to a computational fluid dynamic (CFD) simulator 26. This simulator can be, by way of example, the Power Series Silicon Graphics of 4D-440 manufactured by Silicon Graphics, Inc. located in Mountain View, Calif. FIG. 4 shows a CFD grid for one fin included in a sinusoidal heat sink. The parameters of this fin shown in an XYZ system of coordinates can be adjusted thereby optimizing the heat sink. The CFD simulator can then run a software program, incorporated therein, such as FLUENT, by way of example, with the data included in the first file. The simulator then generates, as an output, a second file which includes a thermal map of the heat sink model. An example of such thermal map of the heat sink model is shown in Appendices 1–3 which will be explained later.

Depending on the desired predetermined temperature response range and on the thermal map generated, the system 20 can optimize the heat sink model such that the thermal map generated by the simulator will approach the desired predetermined temperature response range. Accordingly, if the thermal map generated by the simulator does not fall within the desired predetermined temperature response range, then the model is further optimized by varying any of the geometric parameters of the heat sink included in the first data file. Iterations of simulation and optimization are performed until the model falls within the desired predetermined temperature response range. Then the data included in the first file can be stored by way of example on a floppy disk. The floppy disk can then be inserted into an IGES (Initial Graphic Exchange Specification) translator which translates data from the first file into machine readable data. IGES translators are known in the art and are typically used for transporting CAD files between the CAD and other applications. The translator generates, thus, a standard data file which is further input to the Numerical Control (NC) system 30 shown in FIG. 5.

FIG. 5 shows a numerical control machining apparatus for machining a work piece into a heat sink. The apparatus 1 includes a milling machine 2 with a tool 3 for machining a workpiece 4. The machining apparatus 1 further includes a control device 5 for controlling the movements of the tool 3 relative to the workpiece 4. The control device 5 includes a central processing unit 6 coupled to the internal bus 7 for exchanging information with other components such as a memory 8, a number of input and output interfaces 9 for the input of signals from local tool control device 10 and for output of control signals to an actuator 11 such as a motor, for example. The local tool control device 10 can be arranged to control, among other things, the movement and position of tool 3. Control device 5 also includes a monitor driver 12 for controlling monitor and keyboard 13, and input/output port 14 for coupling to either a mass storage device such as floppy disk or to an external computer system or CAD system such as the system 20 in FIG. 3. The control device 5 may receive, either from the keyboard 13 or from an external device coupled to the input/output port 14, data specifying the profile or contour of the workpiece 4 which is a solid piece of metal to be processed.

Once a prototype of the heat sink is obtained from the numerical control machine, one can use that prototype for building a die-cast from which one can produce by molding a large number of heat sinks in a very short amount of time achieving, thus, reduced costs of manufacture. The manufacturability of the heat sink is, thus, highly increased by the method according to the present invention.

Appendix 1 illustrates, in color, the variations in temperature along the surface of a fin subjected to thermal simulation. According to the thermal simulation, a heat load of 30 watts has been applied to the base plate, while the fins have been cooled by passage of air flown through the spaces between these fins. The blue contour shown in the back corresponds to the temperature of the air flown through the heat sink. The range of blue to red color diagrammatically illustrates the range of temperatures that different parts of a sinusoidal fin will experience after being subjected to thermal simulation. As a result of the cool air flown through the heat sink, the fin is cooler at the front part than at the rear part. As one can see, the lower temperatures at the front part are diagrammatically represented in a more clear yellow-orange color, as opposed to the rear part of the fin which has a higher temperature diagrammatically represented in red. The temperature range in this picture is from 300 to 375 Kelvin or from 0° to 75° C.

Appendix 2 illustrates diagrammatically the distribution of temperature for a straight fin heat sink subject to thermal simulation. As opposed to the sinusoidal heat sink, the range of temperature experienced by the straight fin heat sink is between 0° to 85° C. As one can see, this range of temperatures is 10° C. higher than the range of temperatures for a sinusoidal fin heat sink. The ten degrees Celsius lower temperature range of the heat sink with integral sinusoidal fins constitutes a significant improvement over the conventional straight fin heat sink.

Appendix 3 comparatively illustrates a diagrammatic distribution of temperatures over the vertical surface of the fins of a heat sink with a straight entrance (lower part of the figure) as opposed to a heat sink with an angled entrance (upper part of this figure). These illustrations show clearly the effect of the angled entrance over the distribution of heat throughout the surface of a fin. As one can see, the heat sink with a straight entrance has the lower part of the fins at a higher temperature (illustrated with red and orange) than the heat sink with an angled entrance.

While the present invention has been particularly described with reference to the various figures and embodiments, it should be understood that these are for illustration only and should not be taken as limiting the scope of the invention. Many changes and modifications may be made to the invention by one having ordinary skill in the art, without departing from the spirit and scope of the invention.

What is claimed is:

1. A heat sink comprising:
   a thermally conductive base plate having a top surface, said base plate having a first end and a second end opposite to said first end;
   a plurality of thermally conductive fins upwardly extending from said top surface, each fin being integral with said base plate, each fin having a first portion with a flat lateral surface, said first portion having a first lateral edge inclined backwardly from said first end at a predetermined acute angle, said fin having a second portion contigous with said first portion, said second portion having an undulating fin surface, the fin surfaces of adjacent fins defining a space therebetween for passing a cooling fluid.

2. The heat sink of claim 1 further having side walls integral with said base plate, said side walls having a lateral edge inclined backwardly from said first end at said predetermined acute angle.

3. The heat sink of claim 2 wherein said flat lateral surfaces of said fins are substantially parallel to one another and said undulating fin surfaces are parallel to one another.

4. The heat sink of claim 3 wherein said undulating fin surface is substantially sinusoidal.

5. The heat sink of claim 1 having computer-optimized geometric parameters.

\* \* \* \* \*